US011756629B2

(12) United States Patent
Deng et al.

(10) Patent No.: US 11,756,629 B2
(45) Date of Patent: *Sep. 12, 2023

(54) MEMORY DEVICE AND ASYNCHRONOUS MULTI-PLANE INDEPENDENT READ OPERATION THEREOF

(71) Applicant: YANGTZE MEMORY TECHNOLOGIES CO., LTD., Wuhan (CN)

(72) Inventors: Jialiang Deng, Wuhan (CN); Zhuqin Duan, Wuhan (CN); Lei Shi, Wuhan (CN); Yuesong Pan, Wuhan (CN); Yanlan Liu, Wuhan (CN); Bo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 122 days.

This patent is subject to a terminal disclaimer.

(21) Appl. No.: 17/334,056

(22) Filed: May 28, 2021

(65) Prior Publication Data

US 2022/0310174 A1    Sep. 29, 2022

Related U.S. Application Data

(63) Continuation of application No. PCT/CN2021/083505, filed on Mar. 29, 2021.

(51) Int. Cl.
*G11C 7/00* (2006.01)
*G11C 16/26* (2006.01)
(Continued)

(52) U.S. Cl.
CPC .............. *G11C 16/26* (2013.01); *G11C 16/08* (2013.01); *G11C 16/102* (2013.01); *G11C 16/14* (2013.01); *H03K 19/1737* (2013.01)

(58) Field of Classification Search
CPC ... G11C 7/1006; G11C 7/1051; G11C 7/1078; G11C 7/22; G11C 7/1012
(Continued)

(56) References Cited

U.S. PATENT DOCUMENTS 5,748,547 A    5/1998 Shau
9,792,995 B1 * 10/2017 Shah ..................... G11C 7/1039
(Continued)

FOREIGN PATENT DOCUMENTS

CN    107833592 A    3/2018
CN    112513988 A    3/2021
(Continued)

OTHER PUBLICATIONS

International Search Report issued in corresponding International Application No. PCT/CN2021/083507, dated Jan. 5, 2022, 4 pages.
(Continued)

*Primary Examiner* — Son T Dinh
(74) *Attorney, Agent, or Firm* — BAYES PLLC

(57) ABSTRACT

In certain aspects, a method for operating a memory device is disclosed. The memory device includes memory planes and multiplexers (MUXs). Each MUX includes an output coupled to a respective one of the memory planes, a first input receiving a non-asynchronous multi-plane independent (AMPI) read control signal, and a second input receiving an AMPI read control signal. Whether an instruction is an AMPI read instruction or a non-AMPI read instruction is determined. In response to the instruction being an AMPI read instruction, an AMPI read control signal is generated based on the AMPI read instruction, and a corresponding MUX is controlled to enable outputting the AMPI read control signal from the second input to the corresponding memory plane. In response to the instruction being a non-AMPI read instruction, a non-AMPI read control signal is
(Continued)

generated based on the non-AMPI read instruction, and each MUX is controlled to enable outputting the non-AMPI read control signal from the respective first input to the respective memory plane.

20 Claims, 11 Drawing Sheets

(51) Int. Cl.
*G11C 16/08* (2006.01)
*G11C 16/10* (2006.01)
*G11C 16/14* (2006.01)
*H03K 19/173* (2006.01)

(58) Field of Classification Search
USPC .................................. 365/189.02, 189.15
See application file for complete search history.

(56) References Cited

U.S. PATENT DOCUMENTS

| | | | |
|---|---|---|---|
| 10,381,066 B2 | 8/2019 | Kim et al. | |
| 10,685,722 B1 | 6/2020 | Sharma et al. | |
| 10,877,696 B2 | 12/2020 | Wakchaure et al. | |
| 2006/0083069 A1 | 4/2006 | Fasoli | |
| 2009/0300237 A1 | 12/2009 | Nobunaga et al. | |
| 2016/0005469 A1 | 1/2016 | Kim | |
| 2017/0309340 A1 | 10/2017 | Shah et al. | |
| 2018/0075912 A1* | 3/2018 | Shimizu | G11C 7/1042 |
| 2019/0102088 A1 | 4/2019 | Fang et al. | |
| 2019/0391758 A1 | 12/2019 | Fujiu et al. | |
| 2020/0026466 A1 | 1/2020 | Takano | |
| 2020/0168277 A1 | 5/2020 | Kim et al. | |
| 2020/0411098 A1 | 12/2020 | De Santis | |
| 2022/0310173 A1* | 9/2022 | Deng | G06F 3/0679 |

FOREIGN PATENT DOCUMENTS

| | | |
|---|---|---|
| TW | 200739418 A | 10/2007 |
| TW | 201523615 A | 6/2015 |
| WO | 2009145923 A1 | 12/2009 |
| WO | 2017079066 A1 | 5/2017 |

OTHER PUBLICATIONS

International Search Report issued in corresponding International Application No. PCT/CN2021/083505, dated Jan. 5, 2022, 4 pages.

* cited by examiner

MEMORY DEVICE AND ASYNCHRONOUS MULTI-PLANE INDEPENDENT READ OPERATION THEREOF

CROSS-REFERENCE TO RELATED APPLICATIONS

This application is continuation of International Application No. PCT/CN2021/083505, filed on Mar. 29, 2021, entitled "MEMORY DEVICE AND ASYNCHRONOUS MULTI-PLANE INDEPENDENT READ OPERATION THEREOF," which is hereby incorporated by reference in its entirety. This application is also related to U.S. application Ser. No. 17/334,011, filed on May 28, 2021, entitled "MEMORY DEVICE AND ASYNCHRONOUS MULTI-PLANE INDEPENDENT READ OPERATION THEREOF," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes N memory planes, where N is an integer greater than 1, N asynchronous multi-plane independent (AMPI) read units, a first microcontroller unit (MCU), and a multiplexing circuit coupled to the N memory planes, the N AMPI read units, and the first MCU. Each AMPI read unit is configured to provide an AMPI read control signal for a respective memory plane of the N memory planes to control an AMPI read operation on the respective memory plane. The main MCU is configured to provide a non-AMPI read control signal for each memory plane of the N memory planes to control a non-AMPI read operation on each memory plane. The multiplexing circuit is configured to, in a non-AMPI read operation, direct a non-AMPI read control signal to each memory plane from the first MCU, and in an AMPI read operation, direct each AMPI read control signal of N AMPI read control signals to the respective memory plane from the corresponding AMPI read unit of the N AMPI read units.

In another aspect, a system includes a memory device configured to store data, and a memory controller coupled to the memory device and configured to send an AMPI read instruction or a non-AMPI read instruction to the memory device to control an operation of the memory device on the stored data. The memory device includes N memory planes, where N is an integer greater than 1, N AMPI read units, a first MCU, a multiplexing circuit coupled to the N memory planes, the N AMPI read units, and the first MCU, and an interface coupled to the multiplexing circuit. Each AMPI read unit is configured to provide an AMPI read control signal for a respective memory plane of the N memory planes to control an AMPI read operation on the respective memory plane. The first MCU is configured to provide a non-AMPI read control signal for each memory plane of the N memory planes to control a non-AMPI read operation on each memory plane. The multiplexing circuit is configured to direct a control signal to a corresponding memory plane of the N memory planes from either the first MCU or a corresponding AMPI read unit of the N AMPI read units. The interface is configured to control the multiplexing circuit to, in a non-AMPI read operation, direct the non-AMPI read control signal to each memory plane from the first MCU, and in an AMPI read operation, direct each AMPI read control signal of the N AMPI read control signals to the respective memory plane from the corresponding AMPI read unit.

In still another aspect, a method for operating a memory device is disclosed. The memory device includes a plurality of memory planes and a plurality of multiplexers (MUXs). Each MUX includes an output coupled to a respective one of the memory planes, a first input receiving a non-AMPI read control signal, and a second input receiving an AMPI read control signal. Whether an instruction is an AMPI read instruction or a non-AMPI read instruction is determined. In response to the instruction being an AMPI read instruction, an AMPI read control signal is generated based on the AMPI read instruction, and a corresponding MUX of the MUXs is controlled to enable outputting the AMPI read control signal from the second input to the corresponding memory plane. In response to the instruction being a non-AMPI read instruction, a non-AMPI read control signal is generated based on the non-AMPI read instruction, and each MUX of the MUXs is controlled to enable outputting the non-AMPI read control signal from the respective first input to the respective memory plane.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
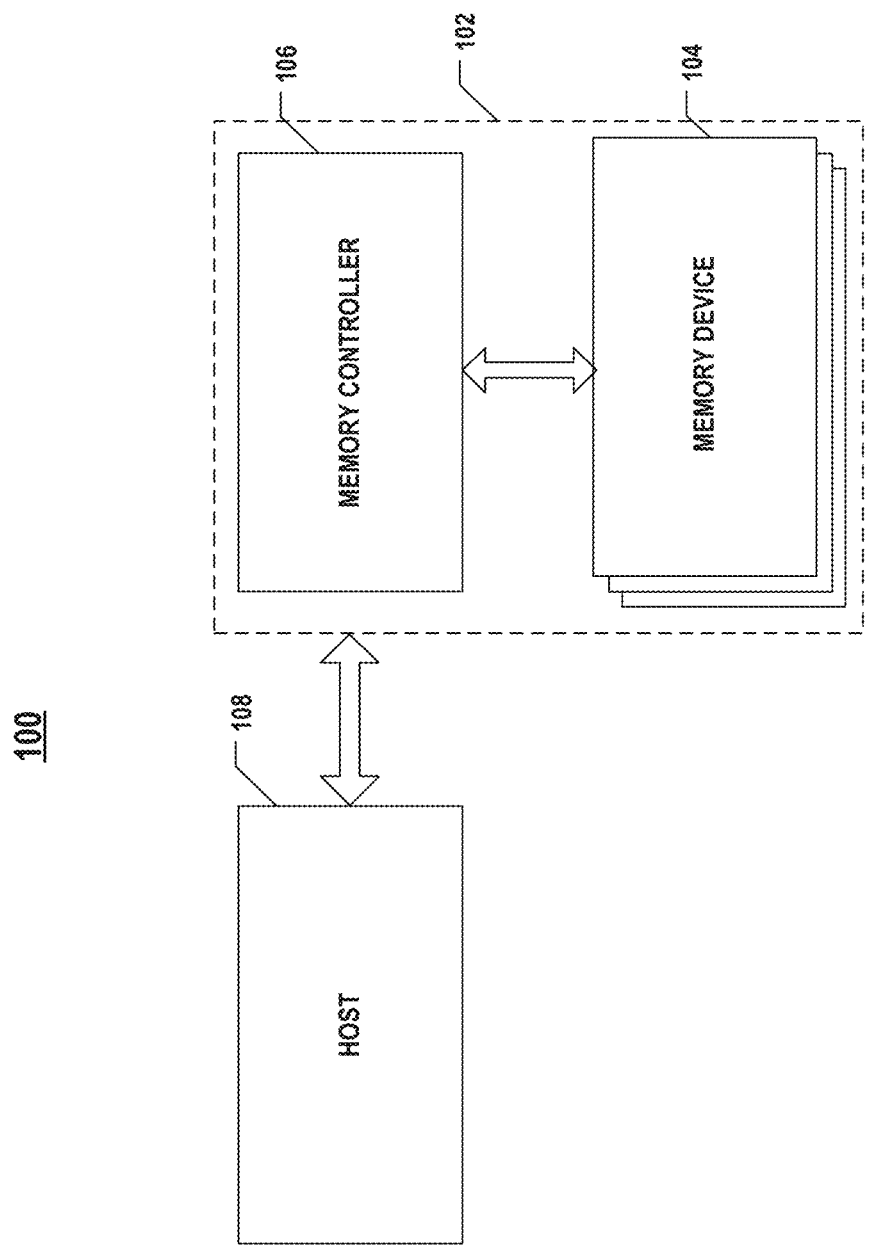
FIG. 1 illustrates a block diagram of an exemplary system having a memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Some memory devices, such as NAND Flash memory devices, can perform read operations at the page level, i.e., reading all the memory cells in the same selected page at the same time. A NAND Flash memory is composed of the blocks of pages, which could be grouped into a memory plane. Depending on the kind of device, planes are in principle mutually independent. A single plane covers local buffering for read and program data and can process operations in parallel, thereby increasing the operation speed.

For some known NAND Flash memory devices, the multi-plane read operations have to be performed in a synchronous manner among different memory planes, known as synchronous multi-plane independent (SMPI) read operations. However, SMPI read operations do not allow the host to issue the read instructions to the memory device when the memory device is busy (e.g., when the Ready/Busy (R/B_n) signal is set to zero). As a result, the system performance is limited.

To address one or more aforementioned issues, the present disclosure introduces a solution in which AMPI read operations can be implemented using an architecture having a main MCU and multiple AMPI read units, each responsible for controlling the AMPI read operation of a respective memory plane. As AMPI read operations allow the host to issue read instructions to the memory device when the memory device is busy, the system performance can be improved. The architecture disclosed herein can include a multiplexing unit that allows multiplexing of AMPI read control signals and control signals for other operations (a.k.a., non-AMPI read control signals) to the same memory plane at different times when performing different types of operations, thereby reducing the number of control units (and the resulting die size and power consumption) used for controlling the multiple planes. In some implementations, the AMPI read units include MCUs implementing firmware stored in memory, such as random-access memory (RAM), which have high flexibility and fault tolerance, as well as provide the soft repair capability in the post-silicon test phase and speed up the products iteration. In some implementations, the AMPI read units include dedicated integrated circuits (ICs), such as application-specific ICs (ASICs), implementing finite-state machines (FSMs), which have high performance, low power consumption, and small die size.

Consistent with the scope of the present disclosure, the single main MCU has the versatility and flexibility to control any non-AMPI read operations (e.g., SMPI read, program, or erase) of multiple memory planes in a synchronous manner. Various designs of the architecture based on the main MCU are disclosed herein. According to some aspects of the present disclosure, the main MCU can be configured to also control the AMPI read operation of one memory plane as well, thereby reducing the number of AMPI read units. According to some aspects of the present disclosure, the main MCU is not dedicated to AMPI read operation of one memory plane so as to simplify its functions, and the same number of AMPI read units and the memory planes are used for AMPI read operations, respectively.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure, such as a NAND Flash memory device, for example, a three-dimensional (3D) Flash memory device, which includes multiple memory planes that can independently perform memory operations, such as read, program, and erase. Consistent with the scope of the present disclosure, memory device 104 can include peripheral circuits, including a main MCU and multiple AMPI read units, capable of handling AMPI read operations on the multiple memory planes. In some implementations, the peripheral circuits of memory device 104 further include a multiplexing circuit configured to, in response to an AMPI enable signal from an interface, direct either an AMPI read control signal or a non-AMPI read control signal to each memory plane.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations by sending instructions, such as SMPI read instruction, AMPI read instruction, erase instruction, and program instruction, to memory device 104. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
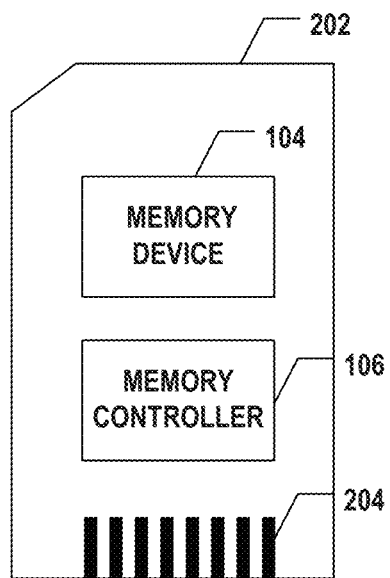
FIG. 2A illustrates a diagram of an exemplary memory card having a memory device, according to some aspects of the present disclosure.
Figure 2B:
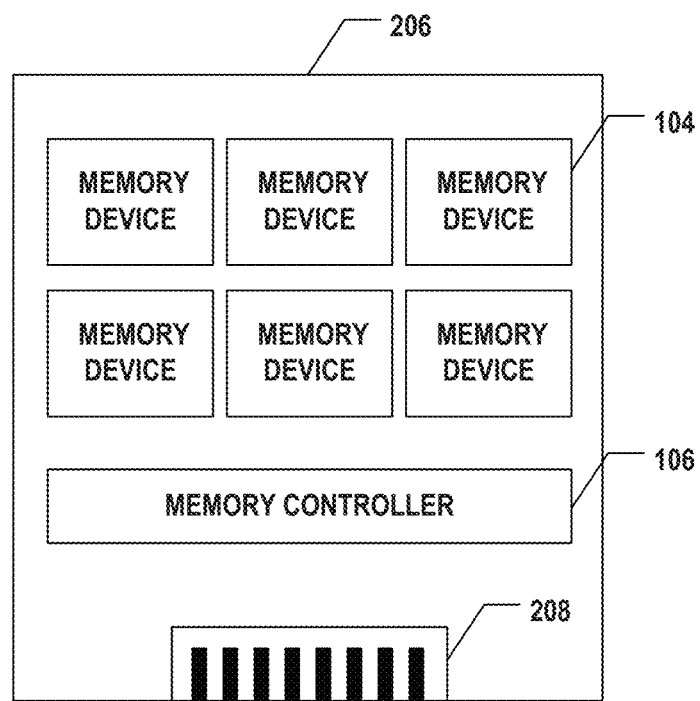
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
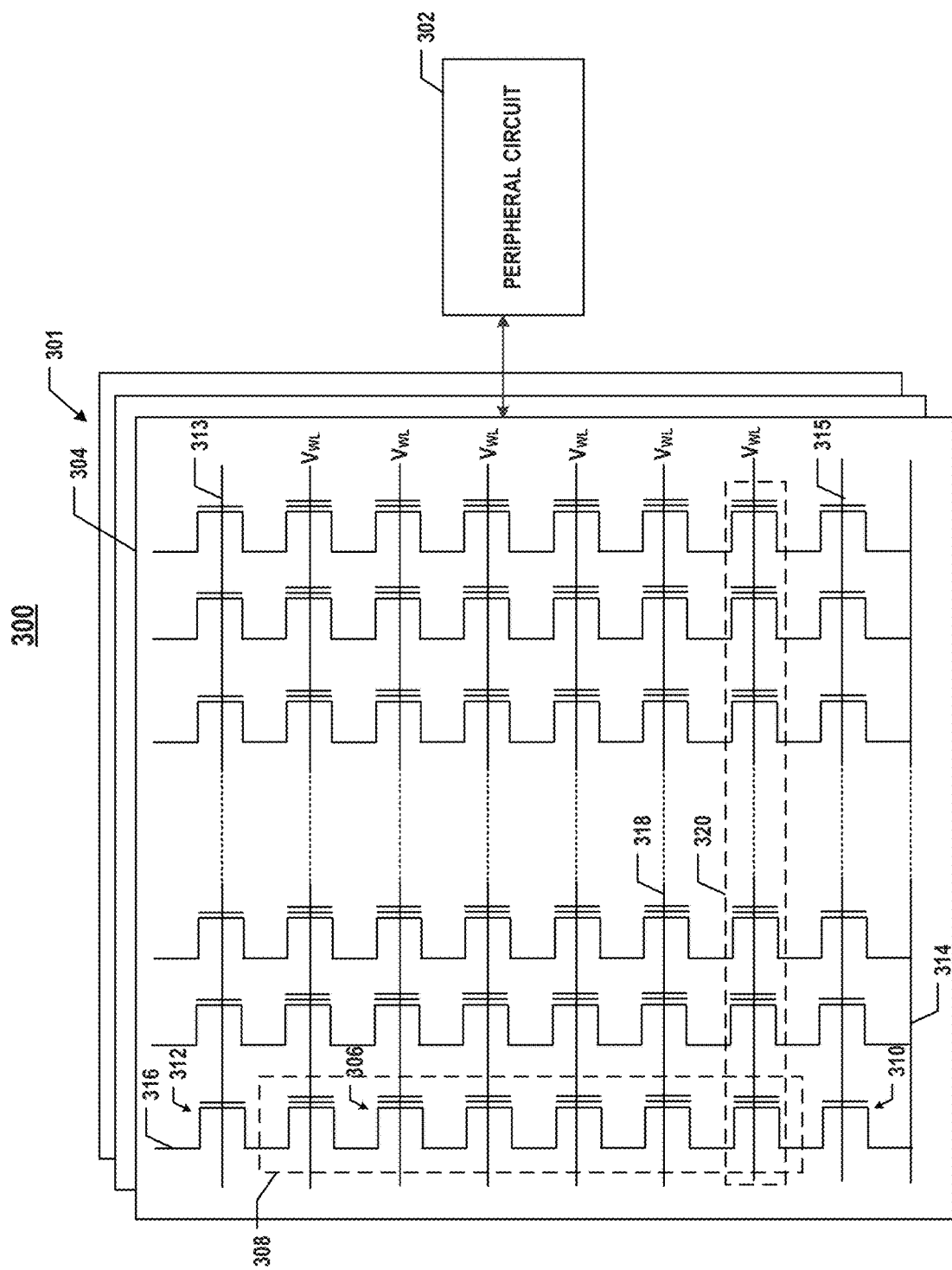
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of DSG transistor 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of DSG transistor 312) or a deselect voltage (e.g., 0 V) to the gate of respective DSG transistor 312 through one or more DSG lines 313 and/or by applying a select voltage (e.g., above the threshold voltage of SSG transistor 310) or a deselect voltage (e.g., 0 V) to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by the read and program operations. In some implementations, each word line 318 is coupled to a page 320 of memory cells 306, which is the basic data unit for the program and read operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
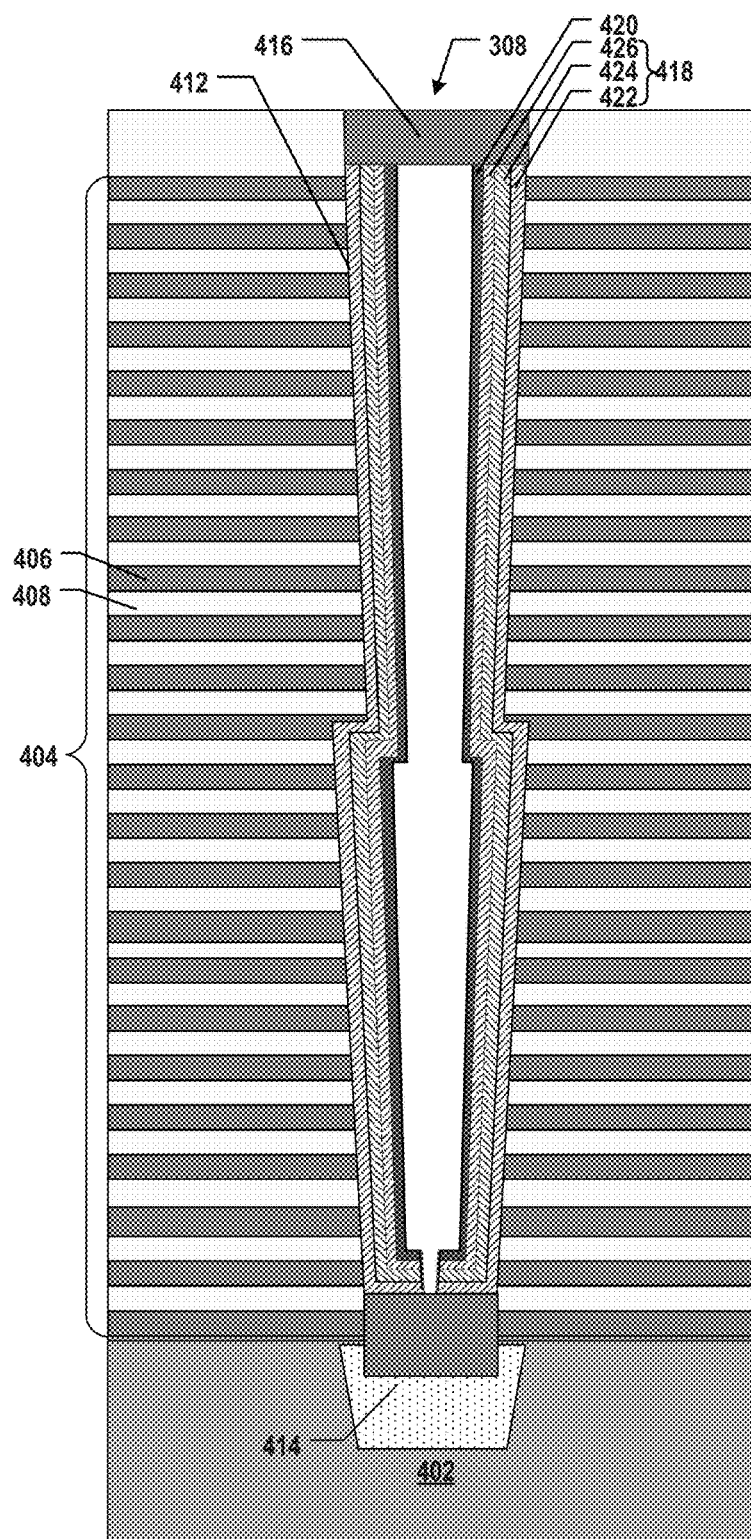
FIG. 4 illustrates a side view of a cross-section of an exemplary memory cell array including a NAND memory string, according to some aspects of the present disclosure.

FIG. 4 illustrates a side view of a cross-section of an exemplary memory cell array 301 including NAND memory strings 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308.

Figure 5:
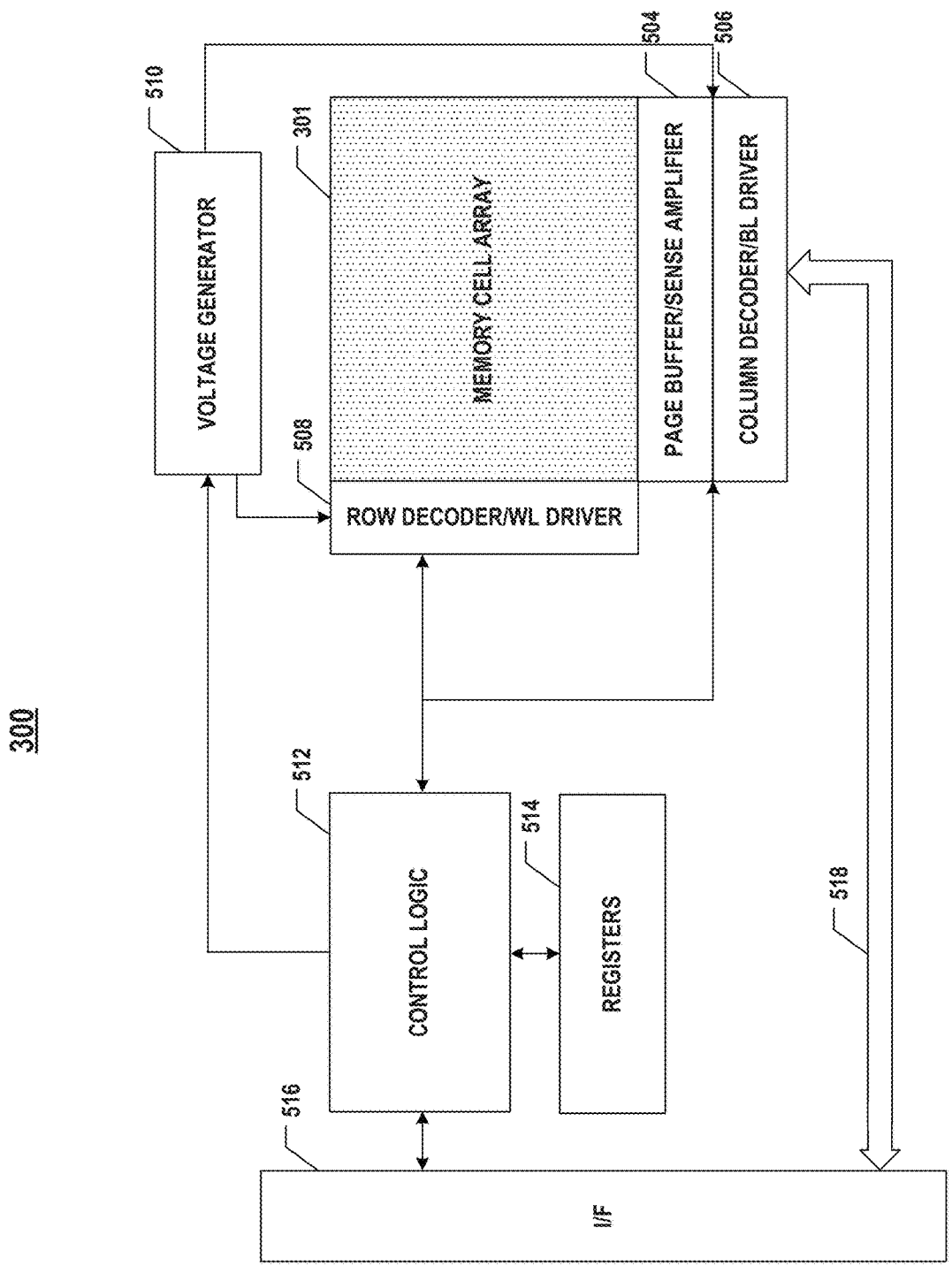
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 according to the control signals from control logic 512 and select one or more NAND memory strings 308 by applying bit line voltages generated from voltage generator 510.

Row decoder/word line driver 508 can be configured to be controlled by control logic 512 according to the control signals from control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 according to the control signals from control logic 512 and generate the word line voltages (e.g., read voltage, program voltage, pass voltage, local voltage, verification voltage, etc.), bit line voltages, and source line voltages to be supplied to memory cell array 301.

Control logic 512 can be coupled to each peripheral circuit described above and configured to control the operations of each peripheral circuit by generating and sending various control signals. As described below in detail, control logic 512 can include a main MCU and multiple AMPI read units in different architectures and implementations to control the AMPI read operations and non-AMPI read operations of multiple memory planes independently. Registers 514 can be coupled to control logic 512 and include status registers, command registers, and address registers for storing status information, command operation codes (OP codes), and command addresses for controlling the operations of each peripheral circuit. For example, registers may include a status register of R/B_n indicative of whether memory device 104 is in a ready state or a busy state.

Interface 516 can be coupled to control logic 512 and act as an instruction fetcher/buffer as well as an instruction decoder to decode instructions received from a memory controller (e.g., 106 in FIG. 1) and relay the decoded instructions to control logic 512. As described below in detail, interface 516 can also generate additional control signals, such as AMPI enable signals, to assist control logic 512 to control other peripheral circuits. Interface 516 can also buffer and relay status information received from control logic 512 to the memory controller (e.g., 106 in FIG. 1). Interface 516 can be coupled to column decoder/bit line driver 506 via data bus 518 and further act as a data input/output (I/O) interface and a data buffer to buffer and relay the data to and from memory cell array 301.

Figure 6:
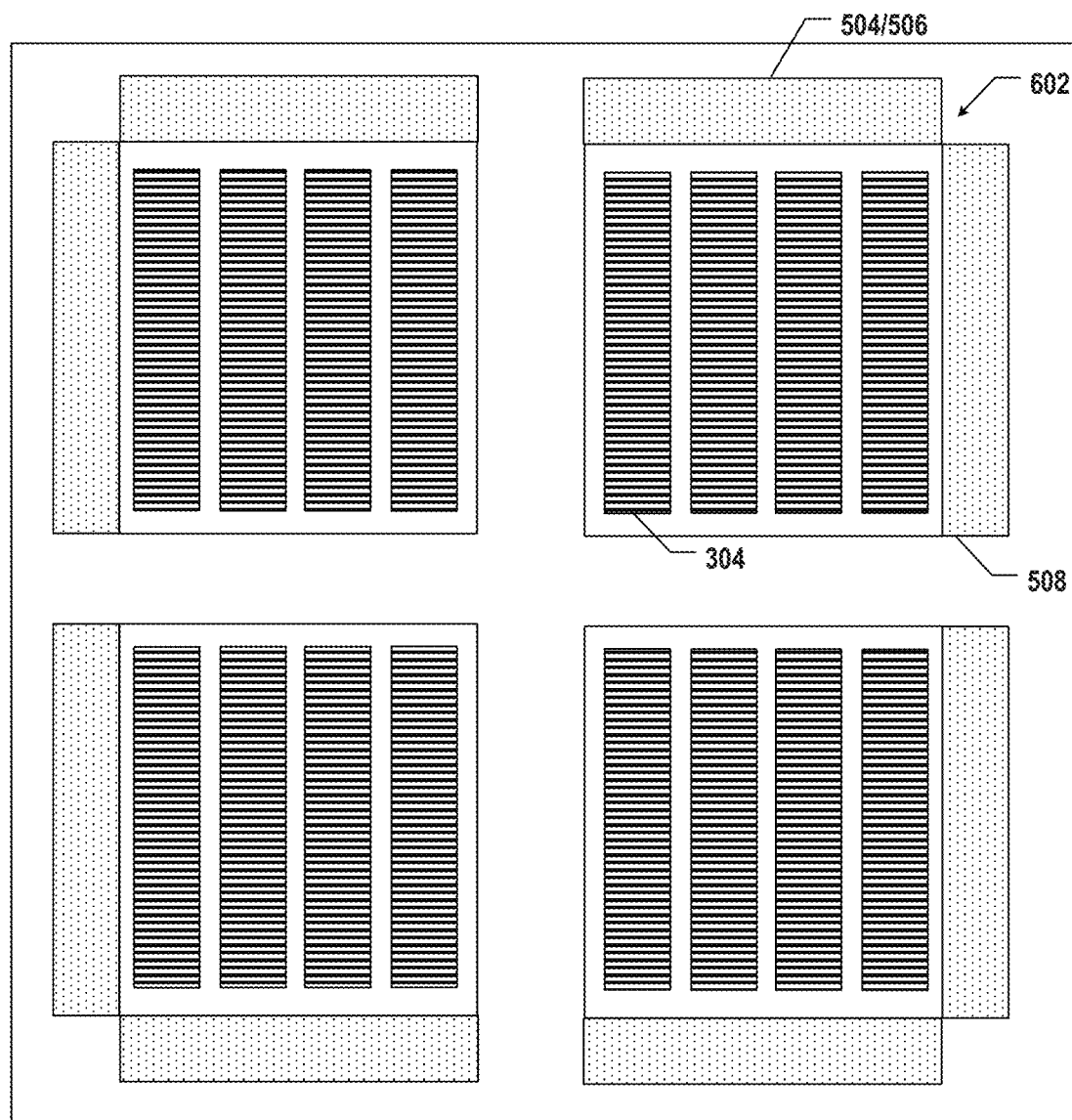
FIG. 6 illustrates a block diagram of an exemplary memory device including multiple memory planes, according to some aspects of the present disclosure.

FIG. 6 illustrates a block diagram of exemplary memory device 300 including multiple memory planes, according to some aspects of the present disclosure. In some implementations, memory device 300 includes a plurality of memory planes 602, i.e., N memory planes, where N is an integer greater than 1 (e.g., 4 in FIG. 6). Memory plane 602 can be mutually independent in performing a read operation, a program operation, or an erase operation. For example, each memory plane 602 may be configured to perform a read operation independently in response to receiving a read control signal from control logic 512. In some implementations, each memory plane 602 covers local buffering for the read and program data and can process operations in parallel, thereby increasing the operation speed. To enable its independent operation, each memory plane 602 can include a set of blocks 304 of memory cell array 301 and a set of peripheral circuits, such as page buffer/sense amplifier 504, column decoder/bit line driver 506, and row decoder/word line driver 508.

Figure 7:
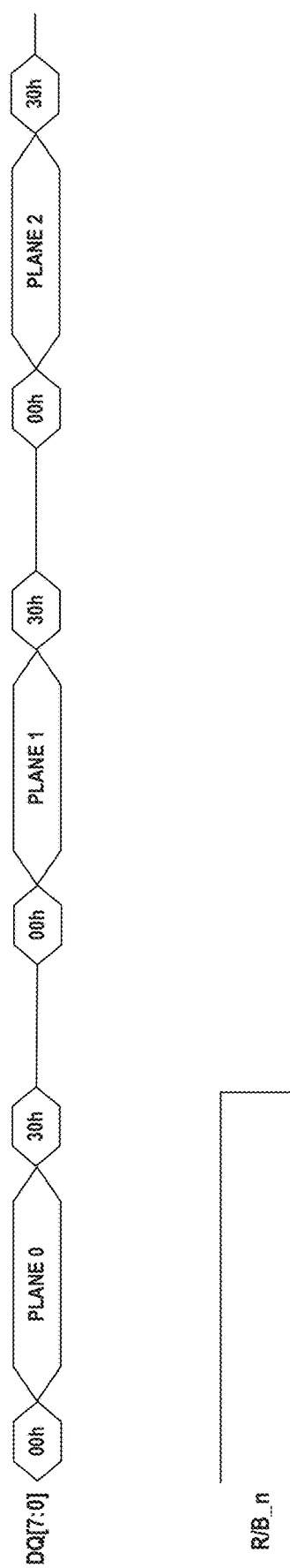
FIG. 7 illustrates a timing diagram of an exemplary AMPI read operation, according to some aspects of the present disclosure.

By separating memory device 300 into independent memory planes 602, multi-plane independent (MPI) read operations in a synchronous manner (i.e., SMPI read operations) or an asynchronous manner (i.e., AMPI read operations) can be performed on multiple memory planes 602 to increase the read speed. For example, FIG. 7 illustrates a timing diagram of an exemplary AMPI read operation, according to some aspects of the present disclosure. As shown in FIG. 7, DQ[7:0] represents an 8-bit bidirectional data bus (e.g., data bus 518 in FIG. 5) transmitting data from or to memory cell array 301 in a read operation or a program operation. In MPI read operations, an MPI read instruction (00h, 30h) indicates reading data from a corresponding memory plane (plane 0, 1, 2, etc.). R/B_n represents a signal indicative of whether memory device 300 is in a read state (set to high) or in a busy state (set to low).

For AMPI read operations, the AMPI read instructions for reading from different memory planes 602 may be sequentially sent by the memory controller (e.g., memory controller 106 in FIG. 1) to memory device 300. As shown in FIG. 7, although the R/B_n signal may be set to low indicating memory device 300 becomes busy when receiving the AMPI read instruction for plane 0, additional AMPI read instructions for reading other memory planes 1 and 2 may still be issued by the memory controller and handled by memory device 300 as AMPI read operations are handled asynchronously, as opposed to SMPI read operations, which are handled synchronously. The AMPI read operations can thus provide higher flexibility to the host (e.g., host 108 in FIG. 1) and the memory controller (e.g., memory controller 106 in FIG. 1) as it can issue an AMPI read operation to memory device 300 at any suitable time even when memory device 300 is busy, thereby improving the performance of the host compared with SMPI read operations, which are limited to be issued at the same time when memory device 300 is not busy.

Figure 8:
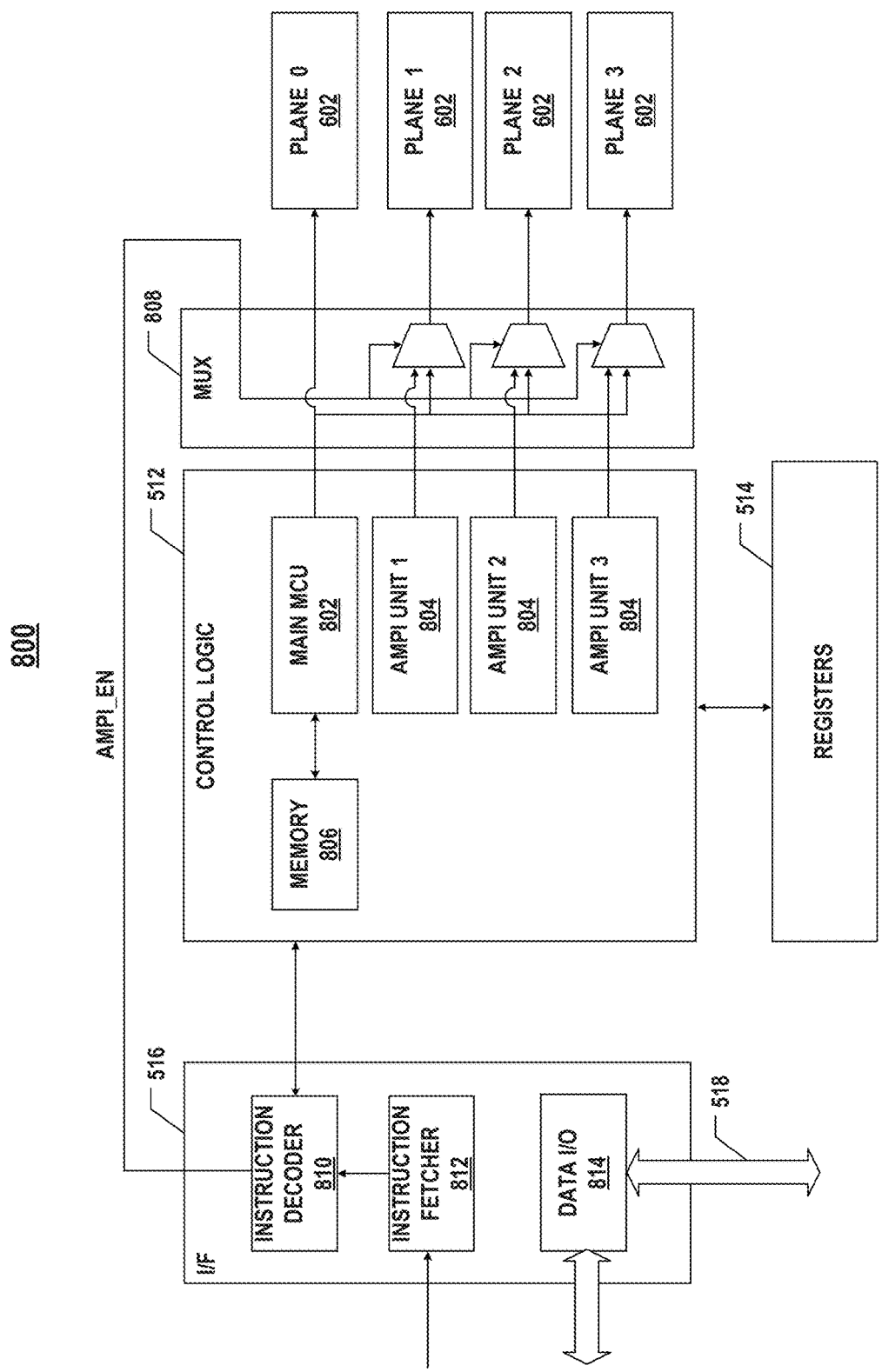
FIG. 8 illustrates a block diagram of an exemplary memory device in performing AMPI read operations and non-AMPI read operations on multiple planes, according to some aspects of the present disclosure.

FIG. 8 illustrates a block diagram of an exemplary memory device 800 capable of performing AMPI read operations and non-AMPI read operations on multiple memory planes, according to some aspects of the present disclosure. Memory device 800 may be one example of memory device 300 in FIGS. 3-6. Memory device 800 can include peripheral circuits including control logic 512, interface 516, registers 514, and a multiplexing circuit (MUX) 808, as well as a plurality of memory planes 602. As shown in FIG. 8, in some implementations, in performing AMPI read operations and non-AMPI read operations on a plurality of memory planes 602, control logic 512 includes a main MCU 802 (also referred to herein as "first MCU") and a plurality of AMPI read units 804, and interface 516 includes an instruction decoder 810, an instruction fetcher 812, and a data I/O 814.

In some implementations, as shown in FIG. 8, memory device 800 includes 4 memory planes 602 (plane 0, 1, 2, and 3). As described herein, the number of memory planes 602 can be generally represented as N, where N is an integer greater than 1, e.g., 2, 3, 4, 5, 6, etc. As described above with respect to FIG. 6, each memory plane 602 can include a set of peripheral circuits (e.g., page buffer/sense amplifier 504, column decoder/bit line driver 506, and row decoder/word line driver 508) that allow independent memory operations, such as read, program, and/or erase operations, on the memory cells in memory plane 602.

Correspondingly, control logic 512 can include N−1 AMPI read units 804. That is, the number of AMPI read units 804 is one less than the number of memory planes 602, according to some implementations. For example, as shown in FIG. 8, control logic 512 may include 3 AMPI read units 804 (AMPI units 1, 2, and 3). On the other hand, control logic 512 also includes main MCU 802, such that the total number (4) of main MCU 802 and AMPI read units 804 is the same as the number (4) of memory planes 602 as shown in FIG. 8. That is, control logic 512 of memory device 800 in FIG. 8 represents an example of a "1+(N−1)" architecture in general in performing AMPI read operations and non-AMPI read operations on N memory planes, where "1" represents a single main MCU 802, and "N−1" represents the number of multiple AMPI read units 804. As described below in detail, in performing AMPI read operations, each one of AMPI read units 804 and main MCU 802 is responsible for controlling the AMPI read operation of a respective memory plane 602, according to some implementations. For example, main MCU 802 may be responsible for plane 0, AMPI unit 1 may be responsible for plane 1, AMPI unit 2 may be responsible for plane 2, and AMPI unit 3 may be responsible for plane 3. It is understood that the mapping shown in FIG. 8 is for illustrative purposes only as long as a one-to-one relationship exists between N memory planes 602, and the "1+(N−1)" main MCU 802 and AMPI read units 804.

In some implementations, main MCU 802 is configured to provide an AMPI read control signal for one of memory planes 602 (e.g., plane 0) to control an AMPI read operation on memory plane 602 (e.g., plane 0), as well as provide a non-AMPI read control signal for each memory plane 602 (e.g., plane 0, 1, 2, or 3) to control a non-AMPI read operation on each memory plane 602. The control signal can include, for example, signals to page buffer/sense amplifier 504 to control the data loading/unloading, signals to column decoder/bit line driver 506 to control the selecting and driving of the bit lines, signals to row decoder/word line driver 508 to control the selecting and driving of the word lines. The non-AMPI read operation can include any suitable memory operation other than AMPI read operations, including, for example, an SMPI read operation, a program operation, or an erase operation. That is, main MCU 802 can have at least dual roles: (1) acting as an AMPI read unit responsible for handling the AMPI read operation control of a respective memory plane 602, e.g., plane 0, and (2) acting as a control unit for handling any non-AMPI read operation control of each memory plane 602, e.g., plane 0, 1, 2, or 3. It is understood that as a generic processing unit of control logic 512, main MCU 802 may perform any other suitable functions of control logic 512 besides AMPI read and non-AMPI read operations control.

To implement the above-mentioned functions, main MCU 802 can include one or more processing cores (e.g., arithmetic-logic units (ALUs)) that can execute firmware and/or software codes stored in a memory 806 coupled to main MCU 802 or as part thereof. It is understood that main MCU 802 may include any suitable types of processors. Memory 806 can include any suitable read-only memory (ROM) and/or random-access memory (RAM) for storing the firmware and/or software codes implementing the functions of main MCU 802 described herein. The firmware and/or software codes in memory 806 can be updated or patched via soft repairing, for example, by loading new firmware and/or software codes into RAM after chip tape out to fix bugs or add additional features to main MCU 802.

In some implementations, each AMPI read unit 804 is configured to provide an AMPI read control signal for a respective memory plane 602 (e.g., plane 1, 2, or 3) to control an AMPI read operation on respective memory plane 602. That is, different from main MCU 802 that also handles non-AMPI read operations (and some other functions as well), AMPI read unit 804 is dedicated to controlling the AMPI read operation of a corresponding memory plane 602, according to some implementations. The control signal can include, for example, signals to page buffer/sense amplifier 504 to control the data loading/unloading, signals to column decoder/bit line driver 506 to control the selecting and driving of the bit lines, signals to row decoder/word line driver 508 to control the selecting and driving of the word lines.

To implement the above-mentioned functions, AMPI read unit 804 can include either an MCU or a dedicated hardware module, for example, IC, such as ASICs. Similar to main MCU 802, the MCU of AMPI read unit 804 can include one or more processing cores (e.g., ALUs) that can execute firmware and/or software codes stored in a memory coupled to the MCU or as part thereof. The above-mentioned functions of AMPI read unit 804 can be implemented by the firmware and/or software codes. As to the ASIC of AMPI read unit 804, it can implement FSM to achieve the above-mentioned functions. It is understood that in some examples, the IC in AMPI read unit 804 may be a field-programmable gate array (FPGA) or any other types of ICs besides ASICs.

Figure 9A:
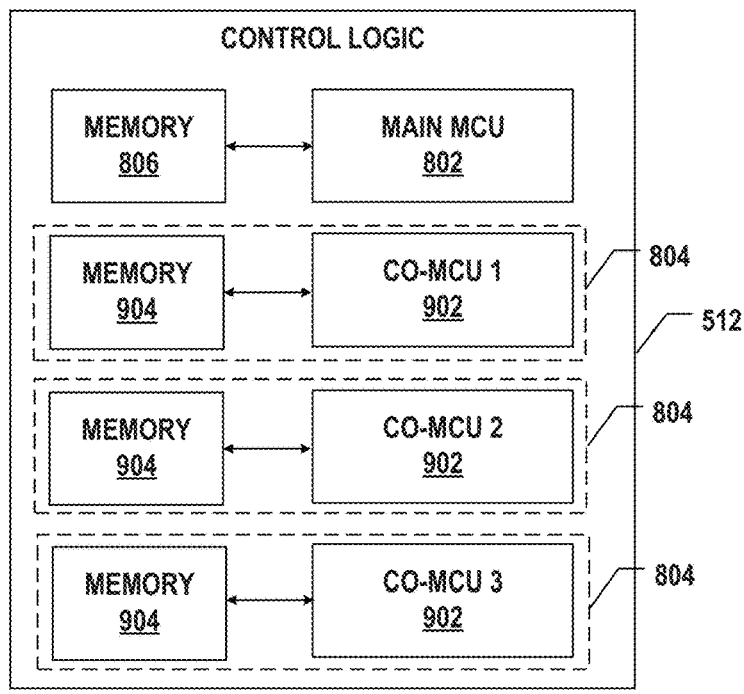
FIGS. 9A and 9B illustrate detailed block diagrams of exemplary control logic of the memory device in FIG. 8 in performing AMPI read operations and non-AMPI read operations on multiple planes, according to some aspects of the present disclosure.

As shown in FIG. 9A, in some implementations, each AMPI read unit 804 includes an MCU 902 (co-MCU 1, 2, or 3, also referred to herein as "second MCU") and a memory 904 coupled to MCU 902. That is, each memory plane 602 is coupled to and controlled by a respective MCU 802 or 902 when performing AMPI read operations, according to some implementations. Each MCU 902 can have the same hardware design as main MCU 802 to ensure uniformity among the control units in controlling AMPI read operations of multiple memory planes 602. The firmware and/or software codes stored in memory 806 and memory 904 and executed by main MCU 802 and co-MCU 902 can be different to cause main MCU 802 and co-MCU 902 to have different functions in terms of AMPI read operations, as described above in detail.

Figure 9B:
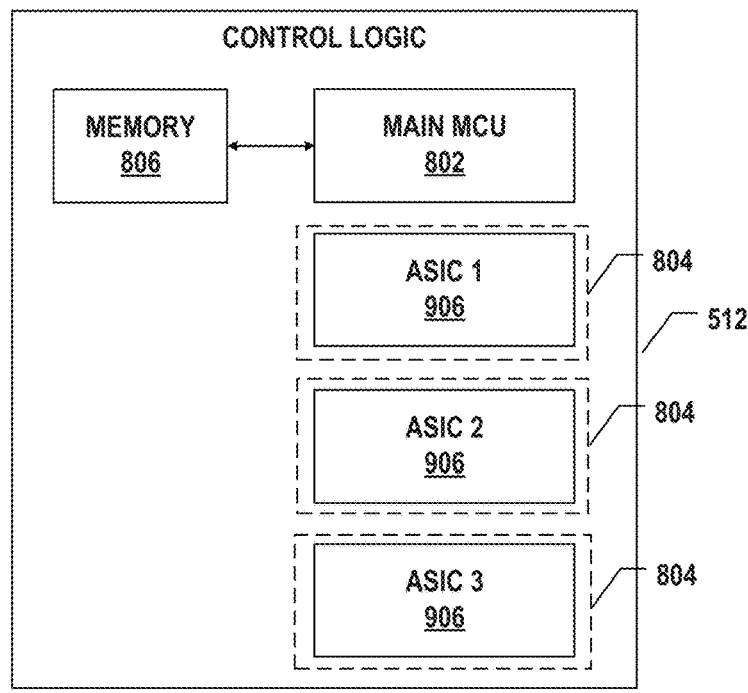

As shown in FIG. 9B, in some implementations, each AMPI read unit 804 includes an ASIC 906 dedicated to performing the AMPI read function disclosed herein. For example, plane 0 of memory plane 602 may be coupled to and controlled by main MCU 802, while plane 1, 2, or 3 of memory plane 602 may be coupled to and controlled by ASIC 1, 2, or 3 of ASICs 906, respectively, when performing AMPI read operations. ASICs 906 can have lower power consumption and higher speed than MCUs 902 due to their dedicated processing nature. It is understood that in some examples, at least one of AMPI read units 804 may include ASIC 906, which allows a mixture of ASIC(s) 906 and co-MCU(s) 902 to implement AMPI read units 804.

FIG. 9A illustrates an example of a homogenous implementation of the control units for AMPI read operation control, which uses MCUs for all the control units (main MCU 802 and AMPI read units 804), while FIG. 9B illustrates an example of heterogeneous implementations of the control units for AMPI read operation control, which uses a mixture of ASIC(s) 906 and MCU(s) 802 or 902 for the control units. For the homogenous implementation, in some examples, one or more co-MCUs 902 are disabled during the idle states, for example, when main MCU 802 is performing non-AMPI read operations, to reduce the power consumption. For example, co-MCU 902 may be disabled in a non-AMPI operation. In some implementations, certain processes of co-MCU 902, such as configuration calculation (e.g., determining the voltage level of the bit line or word line voltage for the next operation phase), are hidden into signal ramping (e.g., voltage ramping up or ramping down) or hold stages to increase the processing speed of AMPI read operation. For example, co-MCU 902 may be configured to hide a process into signal ramping or a hold stage. The process may include a configuration calculation. For the heterogeneous implementations, in some implementations, the performance and quality variations between ASIC(s) 906 and MCU(s) 802 or 902 are taken into account when designing the control units for AMPI read operations.

Referring back to FIG. 8, registers 514 can be coupled to control logic 512 or part of control logic 512 and can be shared by main MCU 802 and each AMPI read unit 804 when performing AMPI read operations, for example, for storing information, such as the R/B_n signal status, the voltage levels of bit line voltage or word line voltages, etc., that is used by AMPI read operations. In some implementations, registers 514 are organized as one or more register files that can be accessed by main MCU 802 and each AMPI read unit 804.

As shown in FIG. 8, memory device 800 can also include multiplexing circuit 808 coupled to memory planes 602 (e.g., N=4, planes 0, 1, 2, and 3), main MCU 802, and AMPI read units 804 (e.g., N−1=3, AMPI units 1, 2, and 3) and configured to direct a control signal to a corresponding memory plane 602 from either main MCU 802 or a corresponding AMPI read unit 804. As main MCU 802 can control the AMPI read operation and non-AMPI read operations of the corresponding memory plane 602 (e.g., plane 0), in some implementations, multiplexing circuit 808 includes a one-to-one connection between main MCU 802 and the corresponding memory plane 602 (e.g., plane 0). As to the other 3 memory planes 602 (e.g., planes 1, 2, and 3), multiplexing circuit 808 can include 3 multiplexers (MUXs) respectively couple 3 AMPI read units 804 to 3 memory planes 602. Each MUX can also couple main MCU 802 to the corresponding memory plane 602. That is, each MUX can include an output coupled to a respective memory plane 602 (e.g., plane 1, 2, or 3), a first input receiving the non-AMPI read control signal from main MCU 802, and a second input receiving the AMPI read control signal from respective AMPI read unit 804. For example, the two inputs of one MUX may be coupled to main MCU 802 and the corresponding AMPI read unit 804 (e.g., AMPI unit 1), respectively, and the output of the MUX may be coupled to the corresponding memory plane 602 (e.g., plane 1), such that either the AMPI read control signal provided by AMPI read unit 804 or the non-AMPI read control signal provided by main MCU 802 may be selected/enabled and outputted to the corresponding memory plane 602.

As shown in FIG. 8, each MUX of multiplexing circuit 808 is also configured to receive a control signal (AMPI_EN) to select/enable one of the two inputs thereof. For example, when the control signal is set to high (e.g., AMPI-EN is enabled), each MUX of multiplexing circuit 808 may enable outputting the corresponding AMPI read control signal from the second input to the corresponding memory plane (e.g., plane 1, 2, or 3); when the control signal is set to low (e.g., AMPI-EN is disabled), each MUX of multiplexing circuit 808 may enable outputting the same non-AMPI read control signal from the first input to the corresponding memory plane (e.g., plane 1, 2, or 3). The control signal (AMPI_EN) does not switch the AMPI read control signal and non-AMPI read control signal to one of memory planes 602 (e.g., plane 0) that is coupled to main MCU 802 through the one-to-one connection, and main MCU 802 itself controls the switch between the AMPI read control signal and non-AMPI read control signal to that memory plane 602 (e.g., plane 0), according to some implementations.

In some implementations, interface 516 can function as both the instruction/control interface through instruction decoder 810 and instruction fetcher 812 (a.k.a. instruction processing unit (IPU) collectively), as well as the data interface through data I/O 814. In some implementations, data I/O 814 is coupled to the host (e.g., host 108 in FIG. 1) and/or the memory controller (e.g., memory controller 106 in FIG. 1) and configured to receive the data to be stored into memory planes 602 and relay the data to data bus 518 in a program operation, and to receive, from data bus 518, the data read from memory plane (2) 602 in an AMPI read operation or an SMPI read operation and relay the read data to the host and/or the memory controller. Instruction fetcher 812, on the other hand, is configured to receive instructions from the host (e.g., host 108 in FIG. 1) and/or the memory controller (e.g., memory controller 106 in FIG. 1), including AMPI read instructions and non-AMPI read instructions (e.g., SMPI read instructions, program instructions, or erase instructions), according to some implementations. Instruction fetcher 812 then can forward the instructions to instruction decoder 810.

In some implementations, instruction decoder 810 is configured to decode each instruction and control the operations of control logic 512 and multiplexing circuit 808 based on the decoded instruction. Based on the decoded instructions, instruction decoder 810 can control the generation of AMPI read control signals and non-AMPI read control signals by control logic 512. In some implementations, in response to obtaining an AMPI read instruction upon decoding, instruction decoder 810 controls main MCU 802 or one of AMPI read units 804 to generate the corresponding AMPI read control signal based on the decoded AMPI read instruction. In some implementations, in response to obtaining a non-AMPI read instruction upon decoding, instruction decoder 810 controls main MCU 802 to generate the non-AMPI read control signal based on the decoded non-AMPI read instruction. As described above, in one example, AMPI read units 804 may be enabled to generate AMPI read control signals only upon instruction decoder 810 obtaining an AMPI read instruction. On the other hand, main MCU 802 may be switched between generating an AMPI read control signal and generating a non-AMPI read control signal based on the type of instruction decoded by instruction decoder 810.

Based on the decoded instructions, instruction decoder 810 can also control the MUXs of multiplexing circuit 808 by enabling or disabling the control signal (e.g., AMPI_EN) to the MUXs. In some implementations, in response to obtaining an AMPI read instruction upon decoding, instruction decoder 810 controls each MUX of multiplexing circuit 808 to enable outputting the corresponding AMPI read control signal from the corresponding AMPI read unit 804 by enabling the control signal. In some implementations, in response to obtaining a non-AMPI read instruction upon decoding, instruction decoder 810 controls each MUX of multiplexing circuit 808 to enable outputting the non-AMPI read control signal from main MCU 802 by disabling the control signal. That is, when performing a non-AMPI read operation (decoding a non-AMPI read instruction), instruction decoder 810 can cause main MCU 802 to provide the non-AMPI read control signal to each memory plane 602; when performing an AMPI read operation (decoding an AMPI read instruction), instruction decoder 810 can cause main MCU 802 or AMPI read unit 804 to provide the AMPI read control signal to a corresponding memory plane 602. As a result, in some implementations, interface 516 is coupled to multiplexing circuit 808 and configured to control multiplexing circuit 808 to, in a non-AMPI read operation, direct the non-AMPI read control signal to each memory plane 602 from main MCU 802, and in an AMPI read operation, direct each AMPI read control signal of the AMPI read control signals to a respective memory plane 602 from main MCU 802 or a corresponding AMPI read unit 804.

Each memory plane 602 can be configured to perform a read operation independently and asynchronously in response to receiving the respective AMPI read control signal from main MCU 802 or a corresponding AMPI read unit 804. Each memory plane 602 can also be configured to perform a read operation independently and synchronously in response to receiving an SMPI read control signal from main MCU 802.

Figure 10:
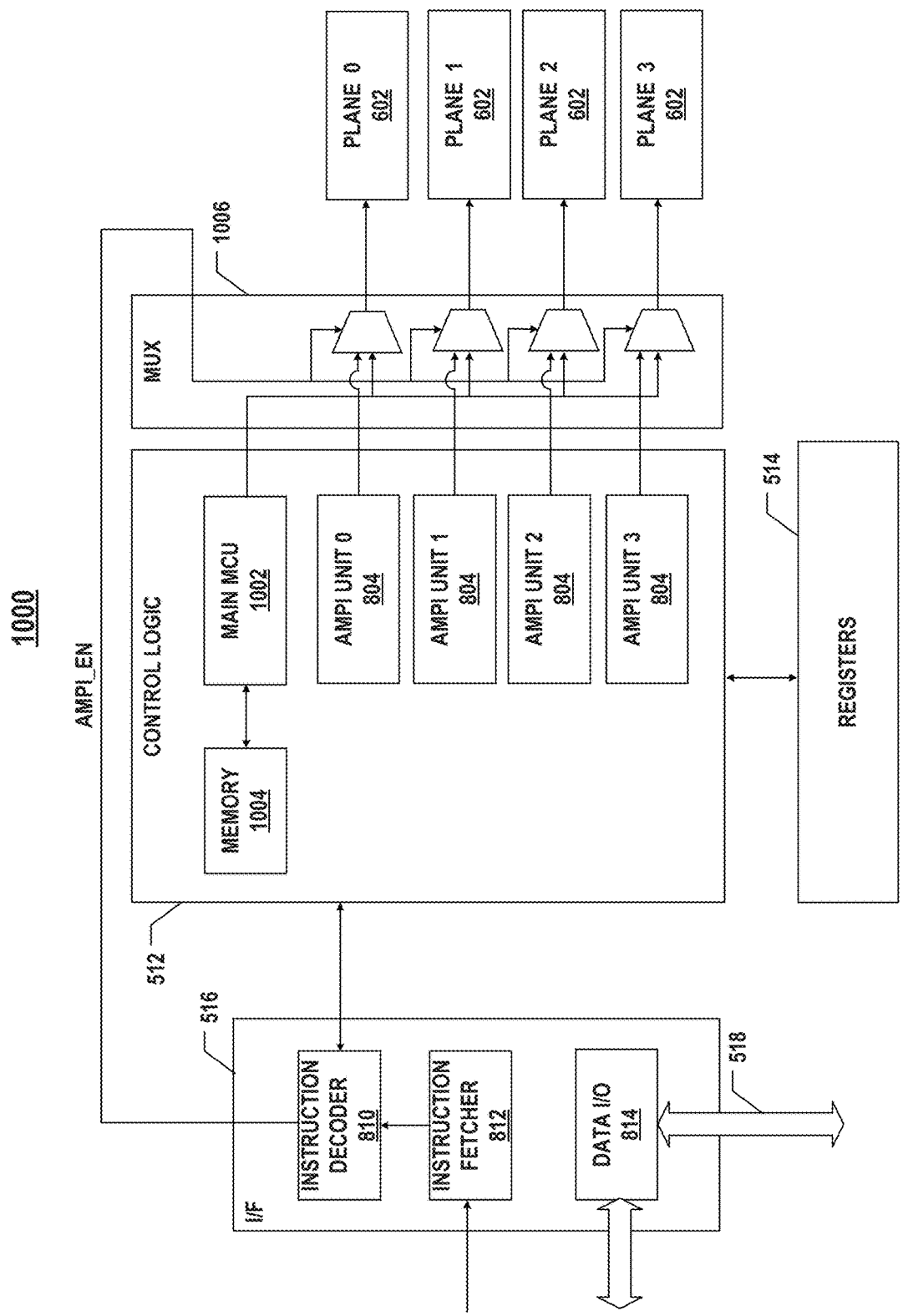
FIG. 10 illustrates a block diagram of another exemplary memory device in performing AMPI read operations and non-AMPI read operations on multiple planes, according to some aspects of the present disclosure.

As described above, control logic 512 of memory device 800 in FIG. 8 represents an example of a "1+(N−1)" architecture in general in performing AMPI read operations and non-AMPI read operations on N memory planes, where "1" represents a single main MCU 802, and "N−1" represents the number of multiple AMPI read units 804. It is understood that control logic 512 may have other architectures in performing AMPI read operations and non-AMPI read operations on N memory planes. For example, FIG. 10 illustrates a block diagram of another exemplary memory device 1000 in performing AMPI read operations and non-AMPI read operations on multiple planes, according to some aspects of the present disclosure. Memory device 1000 may be another example of memory device 300 in FIGS. 3-6. Different from control logic 512 of memory device 800, control logic 512 of memory device 1000 in FIG. 10 represents an example of a "1+N" architecture in general in performing AMPI read operations and non-AMPI read operations on N memory planes, where "1" represents a single main MCU 1002, and "N" represents the number of multiple AMPI read units 804, as described below in detail. For ease of description, the same components in memory devices 800 and 1000 may not be repeated.

Main MCU 1002 can be configured to provide a non-AMPI read control signal for each memory plane 602 of 4 (e.g., N=4) memory planes 602 to control a non-AMPI read operation on each memory plane 602. Different from main MCU 802 in memory device 800, which can also act as an AMPI read unit, main MCU 1002 of memory device 1000 does not generate and provide AMPI read control signals to control the AMPI read operation of any memory plane 602, according to some implementations. In other words, main MCU 1002 can dedicate to controlling all non-AMPI read operations. Similar to main MCU 802, main MCU 1002 can be coupled to a memory 1004 and execute the firmware/software codes stored in memory 1004 to perform its functions disclosed herein. It is understood that in some examples, main MCU 802 and main MCU 1002 may have the same hardware design and structure but run different firmware/software codes to achieve their different functions disclosed herein.

As shown in FIG. 10, different from memory device 800, control logic 512 of memory device 1000 can have the same number (4) of AMPI read units 804 as memory planes 602. That is, N AMPI read units 804 are each configured to provide an AMPI read control signal for a respective memory plane 602 of N memory planes 602 to control an AMPI read operation on respective memory plane 602. Similarly, different from multiplexing circuit 808 of memory device 800, a multiplexing circuit 1006 of memory device 1000 can have the same number (4) of MUXs as AMPI read units 804 and memory planes 602. In some implementations, multiplexing circuit 1006 includes N MUXs respectively couple N AMPI read units 804 to N memory planes 602. For example, each memory plane 602 may be coupled to a corresponding AMPI read unit 804 through a respective MUX of multiplexing circuit 1006. Conversely, multiplexing circuit 1006 does not include any one-to-one connection between main MCU 1002 and any memory plane 602, according to some implementations.

As to instruction decoder 810 of interface 516, in response to obtaining an AMPI read instruction, instruction decoder 810 can control one of AMPI read units 804, but not main MCU 1002, to generate the corresponding AMPI read control signal based on the AMPI read instruction. In response to obtaining a non-AMPI read instruction, instruction decoder 810 still can control main MCU 1002 to generate the non-AMPI read control signal based on the non-AMPI read instruction. In some implementations, interface 516 of memory device 1000 is coupled to multiplexing circuit 1006 and configured to control multiplexing circuit 1006 to, in a non-AMPI read operation, direct the non-AMPI read control signal to each memory plane 602 from main MCU 1002, and in an AMPI read operation, direct each AMPI read control signal of the AMPI read control signals to a respective memory plane 602 from a corresponding AMPI read unit 804.

Each memory plane 602 can be configured to perform a read operation independently and asynchronously in response to receiving the respective AMPI read control signal from a corresponding AMPI read unit 804. Each memory plane 602 can also be configured to perform a read operation independently and synchronously in response to receiving an SMPI read control signal from main MCU 802.

Similar to memory device 800, the control units for AMPI read operation control in memory device 1000 can have the homogenous implementation in which each AMPI read units 804 includes an MCU (e.g., co-MCU in FIG. 9A), or any one of the heterogeneous implementations that use a mixture of ASIC(s) (e.g., ASIC 906 in FIG. 9B) and MCU(s).

Figure 11:
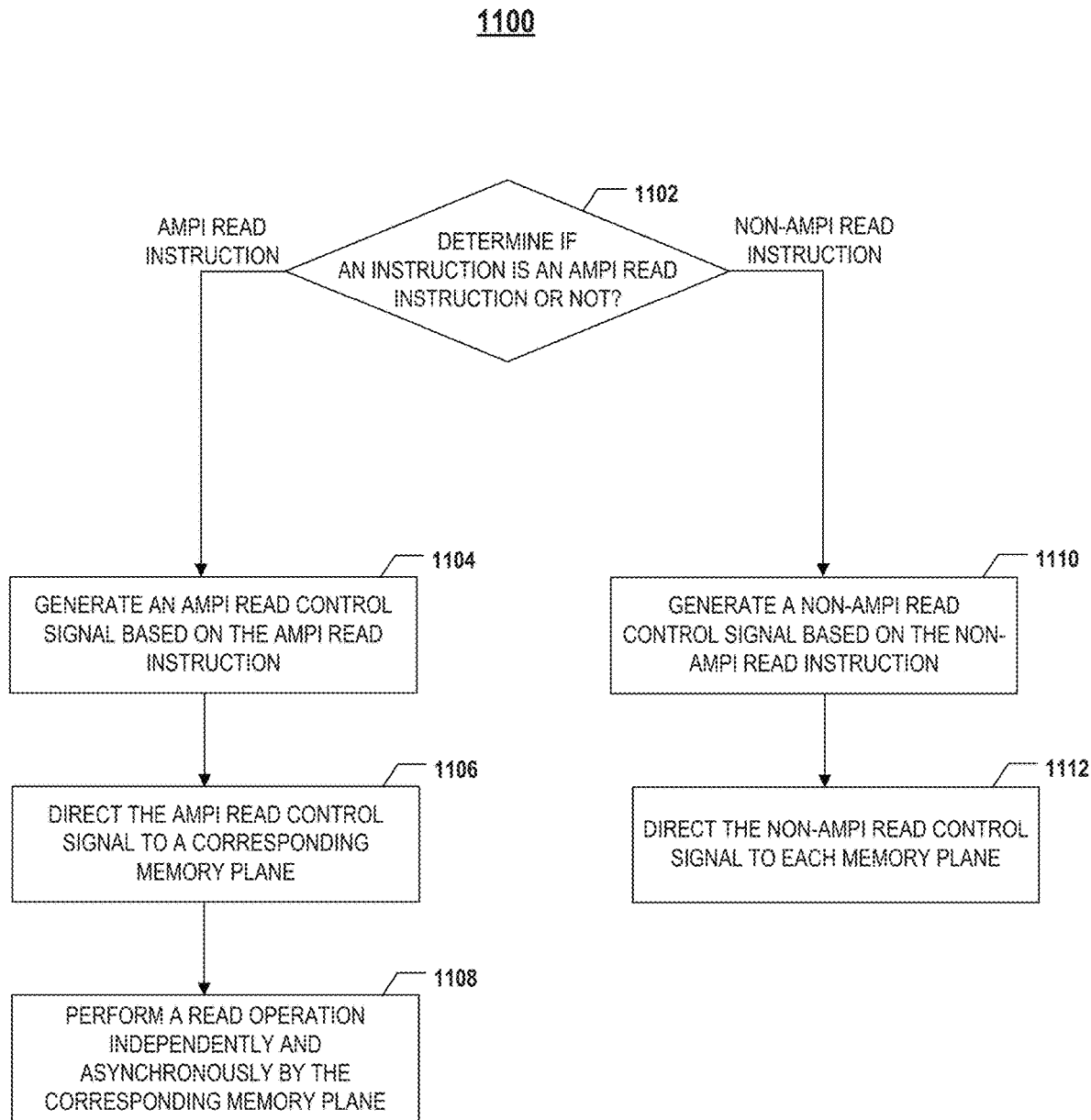
FIG. 11 illustrates a flowchart of an exemplary method for operating a memory device, according to some aspects of the present disclosure.

FIG. 11 illustrates a flowchart of a method 1100 for operating a memory device, according to some aspects of the present disclosure. The memory device may be any suitable memory device disclosed herein, such as memory devices 800 and 1000. Method 1100 may be implemented by memory planes 602, control logic 512, multiplexing circuit 808 or 1006, and interface 516. It is understood that the operations shown in method 1100 may not be exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which whether an instruction is an AMPI read instruction or a non-AMPI read instruction is determined. The non-AMPI read operation can include an SMPI read operation, a program operation, or an erase operation. For example, instruction decoder 810 of interface 516 in memory device 800 or 1000 may determine whether an instruction is an AMPI read instruction or a non-AMPI read instruction upon decoding an instruction from the host or the memory controller.

In response to the instruction being an AMPI read instruction, method 1100 proceeds from operation 1102 to operation 1104, as illustrated in FIG. 11, in which an AMPI read control signal is generated based on the AMPI read instruction. In one example, main MCU 802 or AMPI read unit 804 of control logic 512 in memory device 800 may generate an AMPI read control signal based on the AMPI read instruction. The non-AMPI read control signal and one of the AMPI read control signals may be generated by main MCU 802. Whether the AMPI read control signal is generated by main MCU 802 or AMPI read unit 804 may be determined based on the corresponding memory plane 602 on which the AMPI read operation is to be performed according to the decoded AMPI read instruction. In another example, AMPI read unit 804, but not main MCU 1002 of control logic 512 in memory device 1000 may generate an AMPI read control signal based on the AMPI read instruction. The non-AMPI read control signal, but not the AMPI read control signal, may be generated by main MCU 1002. The specific AMPI read unit 804 to generate the AMPI control signal may be determined based on the corresponding memory plane 602 on which the AMPI read operation is to be performed according to the decoded AMPI read instruction.

Method 1100 proceeds to operation 1106, as illustrated in FIG. 11, in which the AMPI read control signal is directed to a corresponding memory plane of the memory planes. For example, multiplexing circuit 808 in memory device 800 or multiplexing circuit 1006 in memory device 1000 may direct the AMPI read control signal to the corresponding memory plane 602. In some implementations, a corresponding MUX is controlled to enable outputting the AMPI read control signal from the second input to the corresponding memory plane. For example, an MUX of multiplexing circuit 1006 in memory device 1000 may be controlled by interface 516 to enable outputting the AMPI read control signal from the corresponding AMPI read unit 804 to the corresponding memory plane 602. Method 1100 proceeds to operation 1108, as illustrated in FIG. 11, in which a read operation is performed independently and asynchronously by the corresponding memory plane (e.g., memory plane 602) in response to receiving the AMPI read control signal.

In response to the instruction being a non-AMPI read instruction, method 1100 proceeds from operation 1102 to operation 1110, as illustrated in FIG. 11, in which a non-AMPI read control signal is generated based on the non-AMPI read instruction. For example, main MCU 802 of memory device 800 or main MCU 1002 of memory device 1000 may generate a non-AMPI read control signal (e.g., an SMPI read control signal) based on the non-AMPI read instruction.

Method 1100 proceeds to operation 1112, as illustrated in FIG. 11, in which the non-AMPI read control signal is directed to each memory plane. For example, multiplexing circuit 808 in memory device 800 or multiplexing circuit 1006 in memory device 1000 may direct the non-AMPI read control signal to each memory plane 602. In some implementations, each MUX of the MUXs is controlled to enable outputting the non-AMPI read control signal from the respective first input to the respective memory plane. For example, each MUX of multiplexing circuit 1006 in memory device 1000 may be controlled by interface 516 to enable outputting the non-AMPI read control signal from main MCU 1002 to each memory plane 602. In some implementations, a read operation is performed independently and synchronously by each memory plane in response to receiving an SMPI read control signal.

According to one aspect of the present disclosure, a memory device includes N memory planes, where N is an integer greater than 1, N AMPI read units, a first MCU, a multiplexing circuit coupled to the N memory planes, the N AMPI read units, and the first MCU, and an interface coupled to the multiplexing circuit. Each AMPI read unit is configured to provide an AMPI read control signal for a respective memory plane of the N memory planes to control an AMPI read operation on the respective memory plane. The first MCU is configured to provide a non-AMPI read control signal for each memory plane of the N memory planes to control a non-AMPI read operation on each memory plane. The multiplexing circuit is configured to, in a non-AMPI read operation, direct a non-AMPI read control signal to each memory plane from the first MCU, and in an AMPI read operation, direct each AMPI read control signal of N AMPI read control signals to the respective memory plane from the corresponding AMPI read unit of the N AMPI read units.

In some implementations, the memory device further includes an interface coupled to the multiplexing circuit and configured to control the multiplexing circuit to, in the non-AMPI read operation, direct the non-AMPI read control signal to each memory plane from the first MCU, and in an AMPI read operation, direct each AMPI read control signal to the respective memory plane from the corresponding AMPI read unit.

In some implementations, each memory plane is configured to perform a read operation independently and asynchronously in response to receiving the respective AMPI read control signal.

In some implementations, the non-AMPI read operation includes an SMPI read operation, a program operation, or an erase operation.

In some implementations, each memory plane is configured to perform a read operation independently and synchronously in response to receiving an SMPI read control signal.

In some implementations, the multiplexing circuit includes N MUXs respectively coupling the N AMPI read units to the N memory planes, and each MUX of the N MUXs comprises an output coupled to a respective memory plane of the N memory planes, a first input receiving the non-AMPI read control signal from the first MCU, and a second input receiving the AMPI read control signal from the respective AMPI read unit.

In some implementations, the interface includes an instruction decoder configured to in response to obtaining an AMPI read instruction, control one of the MUXs to enable outputting the corresponding AMPI read control signal from the second input.

In some implementations, the instruction decoder is further configured to in response to obtaining a non-AMPI read instruction, control each MUX to enable outputting the non-AMPI read control signal from the first input.

In some implementations, the interface includes an instruction decoder configured to in response to obtaining an AMPI read instruction, control one of the AMPI read units to generate the corresponding AMPI read control signal based on the AMPI read instruction, and in response to obtaining a non-AMPI read instruction, control the first MCU to generate the non-AMPI read control signal based on the non-AMPI read instruction.

In some implementations, each AMPI read unit of the N AMPI read units includes a second MCU.

In some implementations, the second MCU is disabled in the non-AMPI read operation.

In some implementations, the second MCU is configured to hide a process into signal ramping or a hold stage. In some implementations, the process comprises a configuration calculation.

In some implementations, at least one of the N AMPI read units includes an ASCI.

In some implementations, the memory device comprises a 3D Flash memory device.

According to another aspect of the present disclosure, a system includes a memory device configured to store data, and a memory controller coupled to the memory device and configured to send an AMPI read instruction or a non-AMPI read instruction to the memory device to control an operation of the memory device on the stored data. The memory device includes N memory planes, where N is an integer greater than 1, N AMPI read units, a first MCU, a multiplexing circuit coupled to the N memory planes, the N AMPI read units, and the first MCU, and an interface coupled to the multiplexing circuit. Each AMPI read unit is configured to provide an AMPI read control signal for a respective memory plane of the N memory planes to control an AMPI read operation on the respective memory plane. The first MCU is configured to provide a non-AMPI read control signal for each memory plane of the N memory planes to control a non-AMPI read operation on each memory plane. The multiplexing circuit is configured to direct a control signal to a corresponding memory plane of the N memory planes from either the first MCU or a corresponding AMPI read unit of the N AMPI read units. The interface is configured to control the multiplexing circuit to, in a non-AMPI read operation, direct the non-AMPI read control signal to each memory plane from the first MCU, and in an AMPI read operation, direct each AMPI read control signal of the N AMPI read control signals to the respective memory plane from the corresponding AMPI read unit.

In some implementations, each memory plane is configured to perform a read operation independently and asynchronously in response to receiving the respective AMPI read control signal.

In some implementations, the non-AMPI read operation includes an SMPI read operation, a program operation, or an erase operation.

In some implementations, each memory plane is configured to perform a read operation independently and synchronously in response to receiving an SMPI read control signal.

In some implementations, the multiplexing circuit includes N MUXs respectively coupling the N AMPI read units to the N memory planes, and each MUX of the N MUXs comprises an output coupled to a respective memory plane of the N memory planes, a first input receiving the non-AMPI read control signal from the first MCU, and a second input receiving the AMPI read control signal from the respective AMPI read unit.

In some implementations, the interface includes an instruction decoder configured to in response to obtaining an AMPI read instruction, control one of the MUXs to enable outputting the corresponding AMPI read control signal from the second input.

In some implementations, the instruction decoder is further configured to in response to obtaining a non-AMPI read instruction, control each MUX to enable outputting the non-AMPI read control signal from the first input.

In some implementations, the interface includes an instruction decoder configured to in response to obtaining an AMPI read instruction, control one of the AMPI read units to generate the corresponding AMPI read control signal based on the AMPI read instruction, and in response to obtaining a non-AMPI read instruction, control the first MCU to generate the non-AMPI read control signal based on the non-AMPI read instruction.

In some implementations, each AMPI read unit of the N AMPI read units includes a second MCU.

In some implementations, at least one of the N AMPI read units includes an ASCI.

In some implementations, the system further includes a host coupled to the memory controller and configured to send or receive the data.

According to still another aspect of the present disclosure, a method for operating a memory device is disclosed. The memory device includes a plurality of memory planes and a plurality of MUXs. Each MUX includes an output coupled to a respective one of the memory planes, a first input receiving a non-AMPI read control signal, and a second input receiving an AMPI read control signal. Whether an instruction is an AMPI read instruction or a non-AMPI read instruction is determined. In response to the instruction being an AMPI read instruction, an AMPI read control signal is generated based on the AMPI read instruction, and a corresponding MUX of the MUXs is controlled to enable outputting the AMPI read control signal from the second input to the corresponding memory plane. In response to the instruction being a non-AMPI read instruction, a non-AMPI read control signal is generated based on the non-AMPI read instruction, and each MUX of the MUXs is controlled to enable outputting the non-AMPI read control signal from the respective first input to the respective memory plane.

In some implementations, in response to the instruction being the AMPI read instruction, N AMPI read control signals are generated based on the AMPI read instruction by N AMPI read units, and the N AMPI read control signals are directed to the plurality of memory planes, respectively. N can be the number of the plurality of memory planes. In some implementations, in response to the instruction being the non-AMPI read instruction, the non-AMPI read control signal is generated based on the non-AMPI read instruction by a MCU, and the non-AMPI read control signal is directed to each memory plane of the memory planes.

In some implementations, a read operation is performed independently and asynchronously by the corresponding memory plane in response to receiving the AMPI read control signal.

In some implementations, the non-AMPI read operation includes an SMPI read operation, a program operation, or an erase operation.

In some implementations, a read operation is performed independently and synchronously by each memory plane in response to receiving an SMPI read control signal.

In some implementations, the memory device includes an MCU, and the non-AMPI read control signal, but not the AMPI read control signal, is generated by the MCU.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:
1. A memory device, comprising:
N memory planes, where N is an integer greater than 1;
N asynchronous multi-plane independent (AMPI) read units each configured to provide an AMPI read control signal for a respective memory plane of the N memory planes to control an AMPI read operation on the respective memory plane;
a first microcontroller unit (MCU) configured to provide a non-AMPI read control signal for each memory plane of the N memory planes to control a non-AMPI read operation on each memory plane; and
a multiplexing circuit coupled to the N memory planes, the first MCU, and the N AMPI read units and configured to, in a non-AMPI read operation, direct a non-AMPI read control signal to each memory plane from the first MCU, and in an AMPI read operation, direct each AMPI read control signal of N AMPI read control signals to the respective memory plane from the corresponding AMPI read unit of the N AMPI read units.

2. The memory device of claim 1, further comprising:
an interface coupled to the multiplexing circuit and configured to control the multiplexing circuit to, in the non-AMPI read operation, direct the non-AMPI read control signal to each memory plane from the first MCU, and in an AMPI read operation, direct each AMPI read control signal to the respective memory plane from the corresponding AMPI read unit.

3. The memory device of claim 1, wherein each memory plane is configured to perform a read operation independently and asynchronously in response to receiving the respective AMPI read control signal.

4. The memory device of claim 1, wherein the non-AMPI read operation comprises a synchronous multi-plane independent (SMPI) read operation, a program operation, or an erase operation.

5. The memory device of claim 4, wherein each memory plane is configured to perform a read operation independently and synchronously in response to receiving an SMPI read control signal.

6. The memory device of claim 2, wherein
the multiplexing circuit comprises N multiplexers (MUXs) respectively coupling the N AMPI read units to the N memory planes; and
each MUX of the N MUXs comprises an output coupled to a respective memory plane of the N memory planes, a first input receiving the non-AMPI read control signal from the first MCU, and a second input receiving the AMPI read control signal from the respective AMPI read unit.

7. The memory device of claim 6, wherein the interface comprises an instruction decoder configured to in response to obtaining an AMPI read instruction, control one of the MUXs to enable outputting the corresponding AMPI read control signal from the second input.

8. The memory device of claim 7, wherein the instruction decoder is further configured to in response to obtaining a non-AMPI read instruction, control each MUX to enable outputting the non-AMPI read control signal from the first input.

9. The memory device of claim 2, wherein the interface comprises an instruction decoder configured to:
in response to obtaining an AMPI read instruction, control one of the AMPI read units to generate the corresponding AMPI read control signal based on the AMPI read instruction; and
in response to obtaining a non-AMPI read instruction, control the first MCU to generate the non-AMPI read control signal based on the non-AMPI read instruction.

10. The memory device of claim 1, wherein each AMPI read unit of the N AMPI read units comprises a second MCU.

11. The memory device of claim 10, wherein the second MCU is disabled in the non-AMPI read operation.

12. The memory device of claim 10, wherein the second MCU is configured to hide a process into signal ramping or a hold stage.

13. The memory device of claim 1, wherein at least one of the N AMPI read units comprises an application-specific integrated circuit (ASCI).

14. A system, comprising:
a memory device configured to store data; and
a memory controller coupled to the memory device and configured to send an asynchronous multi-plane independent (AMPI) read instruction or a non-AMPI read instruction to the memory device to control an operation of the memory device on the stored data, wherein the memory device comprises:
N memory planes, where N is an integer greater than 1;
N asynchronous multi-plane independent (AMPI) read units each configured to provide an AMPI read control signal for a respective memory plane of the N memory planes to control an AMPI read operation on the respective memory plane;
a first microcontroller unit (MCU) configured to a non-AMPI read control signal for each memory plane of the N memory planes to control a non-AMPI read operation on each memory plane;
a multiplexing circuit coupled to the N memory planes, the first MCU, and the N AMPI read units and configured to direct a control signal to a corresponding memory plane of the N memory planes from either the first MCU or a corresponding AMPI read unit of the N AMPI read units; and
an interface coupled to the multiplexing circuit and configured to control the multiplexing circuit to, in a non-AMPI read operation, direct the non-AMPI read control signal to each memory plane from the first MCU, and in an AMPI read operation, direct each AMPI read control signal of the N AMPI read control signals to the respective memory plane from the corresponding AMPI read unit.

15. A method for operating a memory device comprising a plurality of memory planes and a plurality of multiplexers (MUXs), each MUX comprising an output coupled to a respective one of the memory planes, a first input receiving a non-asynchronous multi-plane independent (AMPI) read control signal, and a second input receiving an AMPI read control signal, the method comprising:
determining whether an instruction is an AMPI read instruction or a non-AMPI read instruction;
in response to the instruction being an AMPI read instruction, generating an AMPI read control signal based on the AMPI read instruction, and controlling a corresponding MUX of the MUXs to enable outputting the AMPI read control signal from the second input to the corresponding memory plane; and
in response to the instruction being a non-AMPI read instruction, generating a non-AMPI read control signal based on the non-AMPI read instruction, and controlling each MUX of the MUXs to enable outputting the non-AMPI read control signal from the respective first input to the respective memory plane.

16. The method of claim 15, wherein
in response to the instruction being the AMPI read instruction, generating N AMPI read control signals, based on the AMPI read instruction, by N AMPI read units, and directing the N AMPI read control signals to the plurality of memory planes, respectively, wherein N is the number of the plurality of memory planes; and
in response to the instruction being the non-AMPI read instruction, generating the non-AMPI read control signal, based on the non-AMPI read instruction, by a microcontroller unit (MCU), and directing the non-AMPI read control signal to each memory plane of the memory planes.

17. The method of claim 15, further comprising performing a read operation independently and asynchronously by the corresponding memory plane in response to receiving the AMPI read control signal.

18. The method of claim 15, wherein the non-AMPI read operation comprises a synchronous multi-plane independent (SMPI) read operation, a program operation, or an erase operation.

19. The method of claim 18, further comprising performing a read operation independently and synchronously by each memory plane in response to receiving an SMPI read control signal.

20. The method of claim 15, wherein the memory device comprises a MCU, and the non-AMPI read control signal, but not the AMPI read control signal, is generated by the MCU.

* * * * *